(12) United States Patent
Takeuchi et al.

(10) Patent No.: US 6,201,235 B1
(45) Date of Patent: Mar. 13, 2001

(54) ELECTRO-OPTIC SAMPLING OSCILLOSCOPE

(75) Inventors: Nobuaki Takeuchi; Yoshiki Yanagisawa; Jun Kikuchi; Nobukazu Banjo; Yoshio Endou; Mitsuru Shinagawa; Tadao Nagatsuma; Junzo Yamada, all of Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/300,287

(22) Filed: Apr. 27, 1999

(30) Foreign Application Priority Data

May 1, 1998 (JP) .................................................. 10-122514

(51) Int. Cl.$^7$ .............................. G01J 1/42; G01R 31/308
(52) U.S. Cl. ............................... 250/214 AG; 250/214 A; 250/214 R; 356/218; 356/222; 324/753; 324/750; 324/752
(58) Field of Search ........................... 250/214 A, 214 C, 250/214 AG, 214 R; 356/218, 222, 226, 345, 346, 349, 366, 367, 368; 324/750, 752, 753, 96

(56) References Cited

U.S. PATENT DOCUMENTS

| | | | |
|---|---|---|---|
| 5,153,667 | * 10/1992 | Aoshima et al. | 356/218 |
| 5,808,473 | * 9/1998 | Shinagawa et al. | 324/753 |
| 6,057,919 | * 5/2000 | Machida et al. | 356/345 |
| 6,087,838 | * 7/2000 | Takeuchi et al. | 324/753 |

FOREIGN PATENT DOCUMENTS

| | | |
|---|---|---|
| 0430661A2 | 6/1991 | (EP) . |
| 08262117 | 10/1996 | (EP) . |
| 0806678A2 | 11/1997 | (EP) . |
| 5-40158 | 2/1993 | (JP) . |
| 5-47883 | 2/1993 | (JP) . |
| 5-72299 | 3/1993 | (JP) . |

(List continued on next page.)

OTHER PUBLICATIONS

M. Shinagawa, et al., "A High–Impedence Probe Based on Electro–Optic Sampling", Proceedings of 15$^{th}$ Meeting on Lightwave Sensing Technology, LST 15–17, May 1995.

*Primary Examiner*—John R. Lee
(74) *Attorney, Agent, or Firm*—Burns, Doane, Swecker & Mathis, LLP (57) ABSTRACT

An electro-optic sampling oscilloscope facilitates adjustment of signal-to-noise ratio caused by electrical, optical and temperature factors. The instrument includes: a light generation section for generation a reference laser beam; a crystal, exhibiting an electro-optic response behavior so as to receive the reference laser beam and to result in changing a refractive index in accordance with electrical field strength generated by target signal; a reflection mirror formed on a rear surface of the crystal for reflecting the reference laser beam that has passed through the crystal; an optical circuit for separating the reference laser beam reflected from the reflection mirror into a first signal light and a second signal light; a first photo-electric conversion section for converting the first signal light into first electrical signals; a second photo-electric conversion section for converting the second signal light into second electrical signals; a differential amplification section for differentially amplifying the first electrical signals and the second electrical signals, and for outputting differentially amplified signals as detection signals of the target signal; and a gain adjustment section for varying gains to adjust a signal-to-noise ratio while the reference laser beam is not being radiated into the crystal, so as to match strength levels of the first electrical signals and the second electrical signals in association with feedback signals of the target signal.

20 Claims, 4 Drawing Sheets

FOREIGN PATENT DOCUMENTS

| | | |
|---|---|---|
| 5-80083 | 3/1993 | (JP) . |
| 5-240895 | 9/1993 | (JP) . |
| 6-94807 | 4/1994 | (JP) . |
| 7-55497 | 3/1995 | (JP) . |
| 7-55891 | 3/1995 | (JP) . |
| 8-43499 | 2/1996 | (JP) . |
| 8-152361 | 6/1996 | (JP) . |
| 8-160110 | 6/1996 | (JP) . |
| 8-262117 | 10/1996 | (JP) . |
| 9-159733 | 6/1997 | (JP) . |
| 9-197019 | 7/1997 | (JP) . |
| 9-211035 | 8/1997 | (JP) . |

\* cited by examiner

ELECTRO-OPTIC SAMPLING OSCILLOSCOPE

BACKGROUND OF THE INVENTION

1. Field of the Invention

The present invention relates to an electro-optic sampling oscilloscope used in various signal measurements.

This application is based on patent appellation No. Hei 10-122514 filed in Japan, the content of which is incorporated herein by reference.

2. Description of the Related Art

In recent times, electro-optic sampling oscilloscopes are favored that can measure ultra-fast bit-rate signals of the order of 2.4 Gbps on a target circuit, without disturbing the operation of the target circuit.

In such an electro-optic sampling oscilloscope, an electro-optic probe based on electro-optic effects is used to detect signals in the target circuit.

Such electro-optic sampling oscilloscopes are favored for measurements in communication technologies that are constantly evolving into ultra-fast systems, because of the following features of the device.

(1) Measurement process is facilitated because the technique does not required a ground line.

(2) Metal pin placed at the end of an electro-optic probe is insulated from the test circuit resulting an extremely high input impedance, so that measurement process hardly affects the performance of the target circuit.

(3) Because optical pulses are used, measurements are possible over a wide bandwidth of the order of GHz.

Figure 5:
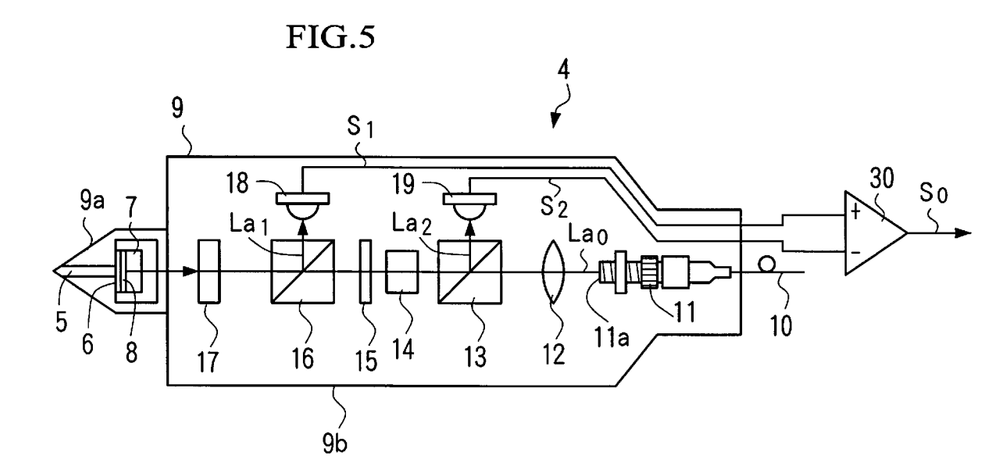
FIG. 5 is a schematic diagram of the electro-optic probe in a conventional electro-optic sampling oscilloscope.

FIG. 5 is a schematic side view showing the components of an electro-optic probe used in a conventional electro-optic sampling oscilloscope. An electro-optic probe 4 is based on a principle that when an electro-optic crystal, that is being subjected to an electrical field generated by the target signal, is irradiated with a laser beam, the polarization state of the laser beam is altered.

In the electro-optic probe 4, a metal probe 5 with a tapered tip touches a signal line in a circuit. The metal pin 5 serves the purpose of facilitating the electrical field of the target signal to affect the condition of the electro-optic (e-o) crystal 7. A circular shaped insulator 6 is provided to contact the end of the metal pin 5 in the center of the rear surface of the insulator. In other words, the metal pin 5 is surrounded by the insulator 6. The e-o crystal 7 is a cylindrical crystal of BSO ($B_{12}SiO_{20}$), and has a property, known as the Pockels' effect, that the primary opto-electric effect, which is its refraction index, is altered in response to an electrical field coupled through the metal pin 5.

A reflection mirror 8 is a dielectric film laminated mirror and is made by vapor deposition of a reflecting substance on the rear surface of the e-o crystal 7. A reference laser beam La0 transmitted through the e-o crystal 7 is reflected by the reflection mirror 8, which is bonded to the front surface of the insulator 6.

A cylindrical casing 9 is comprised by a tube section 9b and an end piece 9a of a tapered-shape integrally formed at one end of the tube section 9b having a hole through the axial center. The end piece 9a houses the metal pin 5, insulator 6, e-o crystal 7 and the reflection mirror 8.

An optical fiber 10 is a polarization-maintaining optical fiber, and connects a connector 11 and a laser generator (not shown). The laser generator generates a linearly polarized reference laser beam La0. The reference laser beam La0 is comprised by base band component signal that does not contain signal components in the measurement band. The connector 11 is disposed so that the reference laser beam La0 output from the ejection end 11a will be injected at right angles to the e-o crystal 7 and the reflection mirror 8. A collimator lens 12 is disposed on the left of the connector 11, and converts the reference laser beam La0 to a parallel beam of light.

A polarized beam splitter 13 is disposed on the left of the collimator lens 12, and transmits a polarized component of the reference laser beam La0 parallel to the plane of the paper in a straight line, while the polarized component of the reference laser beam La0 is bent at 90 degrees to the plane of the paper, and the bent beam is transmitted as the second signal light La2 in a straight line. A Faraday element 14 is disposed on the left of the polarized beam splitter 13, and rotates the polarized component of the reference beam La0, transmitted through the polarized beam splitter 13, at 45 degrees to the plane of the paper.

A half-wave plate 15 is disposed on the left of the Faraday element 14 in such a way that the orientation of its crystal axis in inclined at 22.5 degrees, and re-directs the polarized beam rotated by the Faraday element 14 in a direction parallel to the plane of the paper. A polarized beam splitter 16 is disposed on the left of the half-wave plate 15, and has the same structure as the polarized beam splitter 13, and splits a portion of the reference laser beam La0 reflected from the reflection mirror 8 as the first signal light La1. A full-wave plate 17 is disposed on the left of the polarized beam splitter 16, and adjusts the S/N (signal to noise) ratio of the output signals ultimately obtained from the e-o probe 4, by adjusting the intensity balance of the reference laser beam La0 transmitted through the polarized beam splitter 16. Adjustment of S/N ratio is performed by varying the angle between the reference laser beam La0 and the wave plate 17 by rotating the wave plate 17.

A first photo-diode 18 is disposed above the polarized beam splitter 16, and converts the first signal light La1 (a portion of the reference laser beam La0 split by the polarized beam splitter 16) into first electrical signals and outputs the electrical signals to a positive (+) terminal of a differential amplifier 30. A second photo-diode 19 is disposed above the polarized beam splitter 13, and converts the second signal light La2 (a portion of the reference laser beam La0 split by the polarized beam splitter 13) into second electrical signals and outputs the electrical signals to a negative (−) terminal of the differential amplifier 30.

In such an apparatus, when the metal pin 5 shown in FIG. 5 is made to contact a signal line (not shown), an electrical field of a magnitude, corresponding to the level of the signal in the target circuit, propagating in the signal line, and couples with the e-o crystal 7. Accordingly, refraction index of the e-o crystal 7 changes with the strength of the electrical field. In this condition, a reference laser beam La0 is injected into the front surface of the e-o crystal 7, through the output end 11a of the connector 11, collimator lens 12, polarized beam splitter 13, Faraday element 14, ½ wave plate 15, polarized beam splitter 16 and the wave plate 17.

Under this condition, the polarization state of the reference laser beam La0 propagated through the e-o crystal 7 is changed. Polarization-affected reference laser beam La0 is reflected from the reflection mirror 8, and is output from the front surface of the e-o crystal 7, and is separated in the polarized beam splitter 16. The first signal light La1 produced by this splitting process is converted into first electrical signals in the first photo-diode 18, and the first electrical signal S1 are input in the (+) terminal of the differential amplifier 30.

In the meantime, the second signal light La2 produced by the polarized beam splitter 16 is diverted by the polarized beam splitter 13 to the second photo-diode 19, and is converted into second electrical signal S2 in the second photo-diode 19, and the second electrical signal S2 are input in the (−) terminal of the differential amplifier 30.

Accordingly, the first and second electrical signals S1, S2 are amplified in the differential amplifier 30, in such a way that the in-phase noise components contained in the reference laser beam La0 generated by fluctuation and other factors are canceled.

Differentially amplified signals are input as detection signal S0 of the e-o probe 4 into the input terminal of the sampling oscilloscope.

The result is a display of the waveform of the signals transmitting in the signal line on the display section of the sampling oscilloscope.

It was mentioned above that in the conventional e-o sampling oscilloscope, noise components are canceled in the differential amplifier 30. However, it presupposes that the noises in the first electrical signal S1 and that in the second electrical signal S2 are at the same level.

In practice, however, the noise level contained in the electrical signal S1 (first signal light La1), and the noise level contained in the second electrical signal S2 (second signal light La2) are different because of the following reasons, so that the S/N ratio in the detection signal S0 can be rather high. Some of the reasons are:

(1) Optical properties of the optical components and electrical properties of electrical components are altered due to external factors such as temperature variations, (2) Optical paths for propagation of the first signal light La1 and the second signal light La2 are affected by vibration and pressure and the like, and (3) Electrical properties of the first photo-diode 18 and second photo-diode 19 are not uniform.

To counter such problems, conventional e-o sampling oscilloscopes provide a manual adjustment device to adjust the orientation of the wave plate 17 to improve the S/N ratio in the detection signal S0. However, this process is delicate and requires considerable experience for proper adjustment, and furthermore, a special adjustment device is required for the wave plate 17.

Additionally, in the conventional e-o sampling oscilloscopes, even if the S/N ratio of the detection signal S0 is improved, it still leaves the problem of degrading S/N ratio caused by external factors.

Therefore, the conventional e-o sampling oscilloscope present a cumbersome problem that whenever S/N ratio is degraded, it is necessary to manually adjust the wave plate 17.

SUMMARY OF THE INVENTION

It is an object of the present invention to provide an electro-optic sampling oscilloscope that can easily modify S/N ratio of detection signals.

The object has been achieved in an electro-optic sampling oscilloscope comprising:

a light generation section for generation a reference laser beam;

a crystal, exhibiting an electro-optic response behavior so as to receive the reference laser beam and to result in changing a refractive index in accordance with electrical field strength generated by a target signal;

a reflection mirror formed on a rear surface of the crystal for reflecting the reference laser beam that has passed through the crystal;

an optical circuit for separating the reference laser beam reflected from the reflection mirror into a first signal light and a second signal light;

a first photo-electric conversion section for converting the first signal light into first electrical signals;

a second photo-electric conversion section for converting the second signal light into second electrical signals;

a differential amplification section for differentially amplifying the first electrical signals and the second electrical signals, and for outputting differentially amplified signals as detection signals of the target signal; and a gain adjustment section for varying gains to adjust a signal-to-noise ratio while the reference laser beam is not being radiated into the crystal, so as to match strength levels of the first electrical signals and the second electrical signals in association with feedback signals of the target signal.

The object is also achieved in an electro-optic sampling oscilloscope comprising:

a light generation section for generation a reference laser beam;

a crystal, exhibiting an electro-optic response behavior so as to receive the reference laser beam and to result in changing a refractive index in accordance with electrical field strength generated by a target signal;

a reflection mirror formed on a rear surface of the crystal for reflecting the reference laser beam that has passed through the crystal;

an optical circuit for separating the reference laser beam reflected from the reflection mirror into a first signal light and a second signal light;

a first photo-electric conversion section for converting the first signal light into first electrical signals;

a second photo-electric conversion section for converting the second signal light into second electrical signals;

a first amplifier for amplifying the first electrical signals to a first gain;

a second amplifier for amplifying the second electrical signals to a second gain;

a differential amplification section for differentially amplifying first amplified electrical signals amplified by the first amplifier and second amplified electrical signals amplified by the second amplifier, and for outputting differentially amplified signals as detection signals of the target signal; and a gain adjustment section for varying gains to adjust a signal-to-noise ratio while the reference laser beam is not being radiated into the crystal, so as to match strength levels of the first electrical signals and the second electrical signals by adjusting either the first gain for the first amplifier or the second gain for the second amplifier in association with feedback signals of the target signal.

Additionally, in the present electro-optic sampling oscilloscope, the gain of first electrical signals and the gain of second electrical signals are adjusted by using the gain adjustment section to match each other when the reference beam is not being radiated into the crystal, the detection signals output from the differential amplification section become zero.

Therefore, unlike the conventional electro-optic sampling oscilloscope that requires adjustment of wave plate, the present electro-optic sampling oscilloscope enables to cancel noise components caused by electrical factors, so that S/N ratio of detection signals can be optimized quickly as well as to retain this optimum condition.

The object is also achieved in an electro-optic sampling oscilloscope comprising:

a light generation section for generation a reference laser beam;

a crystal, exhibiting an electro-optic response behavior so as to receive the reference laser beam and to result in changing a refractive index in accordance with electrical field strength generated by a target signal;

a reflection mirror formed on a rear surface of the crystal for reflecting the reference laser beam that has passed through the crystal;

an optical circuit for separating the reference laser beam reflected from the reflection mirror into a first signal light and a second signal light;

a first photo-electric conversion section for converting the first signal light into first electrical signals;

a second photo-electric conversion section for converting the second signal light into second electrical signals;

a differential amplification section for differentially amplifying the first electrical signals and the second electrical signals, and for outputting differentially amplified signals as detection signals of the target signal;

a filter section for transmitting only base band component as base band signals of the reference laser beam while blocking transmission of the target signal contained in the reference laser beam; and a gain adjustment section for varying gains to adjust a signal-to-noise ratio while the reference laser beam is being radiated into the crystal and the target signal are being output at a given level, so as to match strength levels of the first electrical signals and the second electrical signals by adjusting either the first gain for the first amplifier or the second gain for the second amplifier in association with feedback signals of the base band signal.

Additionally, because the present electro-optic sampling oscilloscope uses a filter section to transmit only the base band signals as the base band components from the target signal contained in the detection signals containing a target signal and base band signals of the reference laser beam, it presents an advantage that S/N ratio adjustment can be performed even during the process of measuring the target signal.

DESCRIPTION OF THE PREFERRED EMBODIMENTS

The following embodiments do not affect the scope of the claims. It is not necessary that all the combinations of the features disclosed in the embodiments are required to achieve the objectives.

[Embodiment 1]

Figure 1:
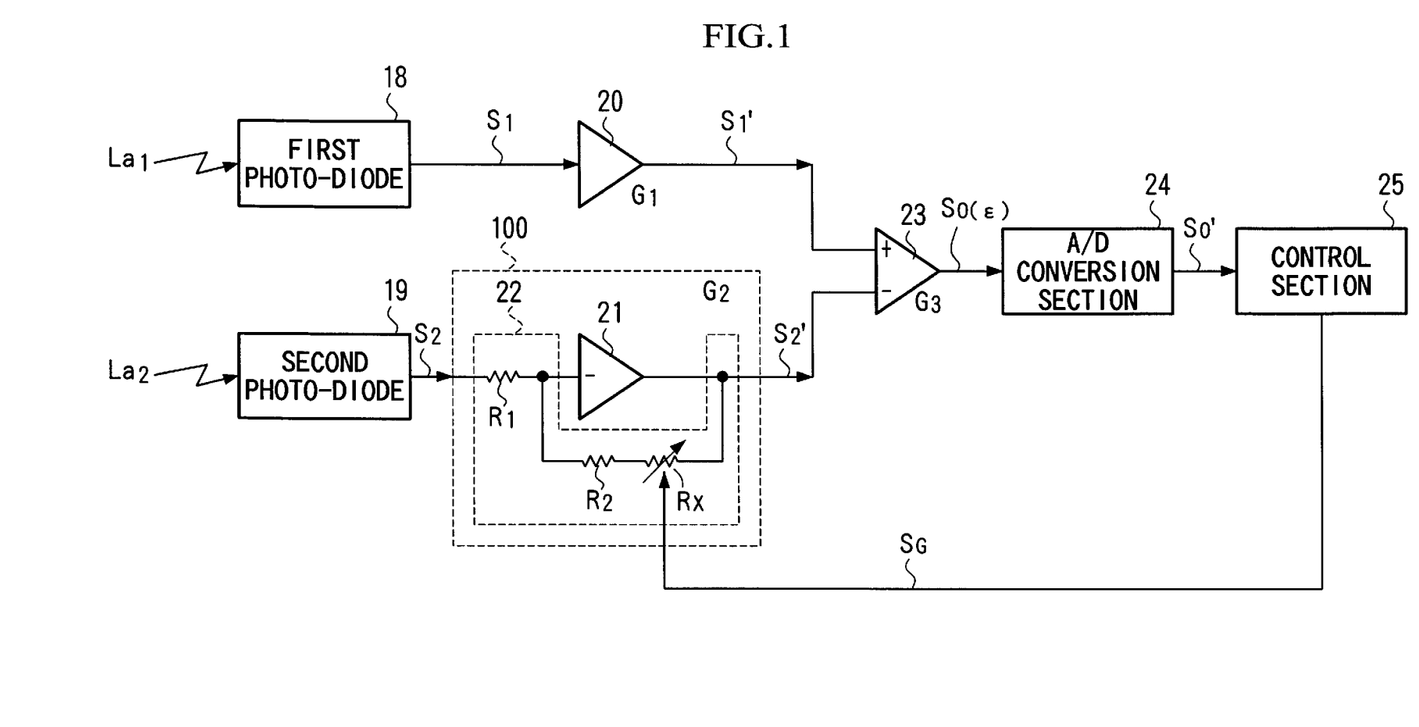
FIG. 1 is a schematic circuit diagram of a first embodiment of the electro-optic sampling oscilloscope of the present invention.

FIG. 1 shows a block diagram of the key parts of the electro-optic sampling oscilloscope, which includes an amplifier of the present invention to replace the differential amplifier shown in FIG. 5.

A first amplifier 20 amplifies first electrical signal S1 output from a first photo-diode (refer to FIG. 5) and outputs amplified signals as first electrical signal S1'. The gain of the first amplifier 20 is designated as G1.

A variable-gain amplifier 100 is a second amplifier, whose gain is designated as G2, and is comprised by an amplification section 21 and a gain adjustment section 22. The second amplifier 100 amplifies second electrical signal S2 output from a first photo-diode (refer to FIG. 5) and outputs amplified signals as second electrical signal S2'.

The gain adjustment section 22 adjust gain G2 of the second amplifier 100 to a value specified by a gain control signal SG. The gain adjustment section 22 is comprised by fixed resistors R1, R2 and an electron volume Rx as a variable resistor. The fixed resistor R1 is connected between the second photo-diode 19 and the amplification section 21. The fixed resistor R2 and the electron volume Rx are connected in series and constitute a series circuit, which is connected in parallel with the amplification section 21. Also, the second fixed resistor R2 and the electron volume Rx perform the role of negative feedback of output signals from the amplification section 21. The resistance of the electron volume Rx is altered by the gain signal SG.

The gain G2 of the second amplifier 100 is given by the following equation where r2 is the resistance value of the fixed resistor R2, and the resistance value of the electron volume Rx is given by rx:

$$G2=(r2+rx)/r1 \qquad (1)$$

A differential amplifier 23 differentially amplifies first electrical signal S1' received in its (+) input terminal and second electrical signal S2' received in its (−) input terminal, and outputs detection signal S0. The gain of the differential amplifier 23 is designated as G3. An analogue-to-digital (A/D) conversion section 24 converts analogue detection signal S0 to digital detection signal S0'.

A control section 25 controls the gain G2 of the second amplifier 100 so that the level (absolute value) of the detection signal S0' (detection signal S0) will be a minimum or zero. Specifically, the control section 25 computes a resistance value rx of the electron volume Rx so that the level of the detection signal S0' will be a minimum or zero using an equation (to be described later), and outputs a gain control signal SG, varying with the resistance value rx, to the electron volume Rx.

In this case, achieving a minimum or zero for the detection signal S0' means that the levels of the first and second electrical signals S1' and S2' are matched (balanced state). In more basic terms, it means that the in-phase noise components contained in the first and second electrical signals S1', S2', i.e., first and second signal light La1 and La2, are canceled. The operation of the control section 25 will be explained in more detail later.

The process of S/N ratio adjustment in the first embodiment will be explained below.

Here, the differences in the electrical characteristics of the first and second photo-diodes 18, 19 are defined as electrical factors.

Reviewing the e-o probe 4 shown in FIG. 5, this probe is in the non-measuring state, therefore, there is no effect of signals in the target line, and no S/N ratio adjustment is being made.

When the probe is to carry out S/N adjustments, the laser generator is stopped. It follows that there will be no reference laser light La0 in FIG. 5 so that there will be no input of first and second signal light La1 and La2 into the respective photo-diodes 18, 19 shown in FIG. 1. Therefore, in principle, there is no output of first and second electrical signals S1, S2 from the respective first and second photo-diodes 18, 19.

However, in practice, first and second signals S1, S2 are still being output as noise signals caused by the effects of dark current and external noises and the like on the first and second photo-diodes 18, 19.

Also, it is supposed that the electrical properties of the first amplifier 20, second amplifier 100 and differential amplifiers are not uniform.

Thus, the first electrical signal S1 is amplified in the first amplifier 20 with a gain of G1, and the amplified first electrical signal S1' is input in the (+) terminal of the differential amplifier 23.

In the meantime, the second electrical signal S2 is amplified in the second amplifier 100 with a gain of G2, and the amplified first electrical signal S2' is input in the (−) terminal of the differential amplifier 23.

Accordingly, the differential amplifier 23 differentially amplifies first and second amplified signals S1', S2'. Because the levels of the first and second amplified signals S1', S2' are different, the detection signal S0 output from the differential amplifier 23 is not zero. The detection signal S0 is converted in the A/D conversion section 24 into digital detection signal S0', and input in the control section 25.

Accordingly, the control section 25 adjusts the gain control signal SG, in association with feedback signals of S0', so as to make the detection signal S0' zero. This results in changing the resistance value rx of the electron volume Rx to lead to changes in the gain G2 of the second amplifier 100, expressed in equation (1).

When the detection signal S0' becomes zero, the control section 25 maintains the level of gain control signal SG given by the computation.

As explained above, the e-o sampling oscilloscope of the first embodiment is able to match apparent electrical properties of the first and second photo-diodes 18, 19 by adjusting the gain G2 of the second amplifier 100.

Further, in addition to correcting noise caused by electrical factors, noises caused by optical and temperature factors can also be corrected by undertaking the following procedure to further improve the S/N ratio.

It is again assumed that the starting point of the procedure is as shown in FIG. 5 so that the e-o probe 4 is in the non-measuring state, and is not affected by signals flowing in the target line.

In this state, as mentioned earlier, the reference laser beam La0 shown in FIG. 5 is injected into the front surface of the e-o crystal 7, through the output end 11a of the connector 11, collimator lens 12, polarized beam splitter 13, Faraday element 14, ½ wave plate 15, polarized beam splitter 16 and the wave plate 17. It is assumed that fluctuation noise components are contained in the reference laser beam La0.

In this case, because the field effect of the target signal is not coupled with the crystal 7, the polarization state of the reference laser beam La0 propagating in the crystal 7 does not change.

Then, the reference laser beam La0 is reflected by the reflection mirror 8 and is output from the front surface of the crystal 7, and is separated into first signal light La1 and second signal light La2, respectively by the polarizing beam splitters 16, 13. In this case, both the first and second signal lights La1, La2 contain only the base band signal components, and no target signal component is included.

At this time, first signal light La1 from the beam splitter 16 is input in the first photo-diode 18 shown in FIG. 5, and is converted into first electrical signal S1.

In the meantime, second signal light La2 from the polarized beam splitter 13 is input in the second photo-diode 19 shown in FIG. 5, and is converted into second electrical signal S2.

It is supposed that the intensity of first signal light La1 is lower than that of the second signal light La2 caused by factors mentioned above such as optical and temperature factors. It is further supposed that the electrical properties of the first and second photo-diodes 18, 19 are different such that the level of the first electrical signal S1 is lower that the level of the second electrical signal S2.

Thus, the first electrical signal S1 is amplified in the first amplifier 20 with a gain of G1, and the amplified first electrical signal S1' is input in the (+) terminal of the differential amplifier 23.

In the meantime, the second electrical signal S2 is amplified in the second amplifier 100 with a gain of G2, and the amplified first electrical signal S2' is input in the (−) terminal of the differential amplifier 23.

Accordingly, the differential amplifier 23 differentially amplifies first and second amplified signals S1', S2'. Because the levels of the first and second amplified signals S1', S2' are different, the detection signal S0 output from the differential amplifier 23 is not zero.

In other words, although signal level differences caused by electrical factors have been corrected in the e-o sampling oscilloscope, there are signal level differences caused by optical and temperature factors.

The detection signal S0 are converted in the A/D conversion section 24 into digitized detection signal S0', and are input in the control section 25.

Thus, the control section 25 adjusts the gain control signal GS, in association with the feedback signals of S0', so as to make the detection signal S0' zero.

That is, the control section 25 obtains an error level $\epsilon$ of the current detection signal S0' (detection signal S0). In this case, suppose that the error level of $\epsilon$ is $\epsilon_1$.

Next, the control section 25 obtains a resistance value rx of the electron volume Rx from the gain control signal SG, and the resistance value rx, known values of fixed resistance R1, resistance values r1 and r2 are input in equation (1) to obtain a value of the gain G2 for the second amplifier 100.

Next, the control section 25 varies the value of the gain G2 of the second amplifier 100 to G2' by adjusting the gain control signal GS. This operation changes the level of second electrical signal S2, thereby changing the level $\epsilon$ of the detection signal S0 (detection signal S0') from $\epsilon 1$ to $\epsilon 2$.

Here, the signal level $\epsilon_1$ of the detection signal S0 (detection signal S0') at the gain G2 of the second amplifier 100 is given by the following equation (2), while the signal level $\epsilon_2$ of the detection signal S0 (detection signal S0') at the gain G2' of the second amplifier 100 is given by the following equation (3):

$$\epsilon_1 = (S1 \cdot G1 - s2 \cdot G2)G3 \qquad (2) \text{ and}$$

$$\epsilon_2 = (s1 \cdot G1 - s2 \cdot G2')G3 \qquad (3)$$

where s1 and s2 are signal levels for the first and second electrical signals S1, S2, and are unknown, G1, G3 are, respectively, values of the gain of the first amplifier 20 and the differential amplifier 23.

By solving simultaneous equations including the above equations (2), (3), the unknown signal levels can be expressed as in equations (4), (5) shown below.

$$s1=(\epsilon1-\epsilon2)/G3(G2'-G2) \quad (4)$$

$$s2=(1/G1\cdot G3)(\epsilon1+G2(\epsilon1-\epsilon2)/(G2'-G2)) \quad (5).$$

Further, the gain G2" ($\epsilon$=0) of the second amplifier 100, for reducing the signal level $\epsilon$ for the detection signal S0 (detection signal S0') to zero, is given by the signal levels s1, s2, for the first and second electrical signals S1, S2, according to the following equation (6).

$$G2"(\epsilon=0)=(s1/s2)\cdot G1 \quad (6)$$

Next, in order to reduce the error level $\epsilon1$ of the detection signal S0 at the gain G2 of the second amplifier 100 to zero, the control section 25 computes gain G2" by substituting the values of signal levels s1 and s2 obtained from equations (4) and (5) for s1 and s2, together with the known value of G1 of the differential amplifier 23 for G1, in equation (6).

Next, the control section 25 obtains equation (7) from equation (1) by solving for the resistance value rx of the electron volume Rx.

$$rx=r1\cdot G2-r2 \quad (7)$$

Next, the control section 25 computes the resistance value rx of the electron volume Rx, by substituting in equation (7), the known value of r1 of the fixed resistor R1 for r1, the value of G2" obtained from equation (6) for G2, and the known resistance value r2 of the fixed resistor R2 for r2.

At this time, the control section 25 outputs a gain control signal SG to correspond with the resistance value rx of the electron volume Rx obtain in equation (7). The resistance value rx of the electron volume Rx is thus altered, resulting in changing the gain of the second amplifier 100 from G2' to G2".

Therefore, because the signal level (s1·G1) of the first electrical signal S1' is now matched with the signal level (s2·G2") of the second electrical signal S2', the detection signal S0 output from the differential amplifier 23 becomes zero.

That is, the differential amplifier 23 is completely freed of all noise components, contained in the reference laser beam La0, caused by fluctuations due to such factors as electrical, optical and temperature effects.

Also, in this condition, the properties of the systems (optical and electrical) involved in the path through the first photo-diode 18 and the second photo-diode 19 are matched, so that noise components generated by electrical factors are canceled, without adjusting the wave plate 17.

As explained above, the first embodiment of the e-o sampling oscilloscope is able to nullify all the noise components contained in the reference laser beam La0 without having to adjust the wave plate 17 (refer to FIG. 5), or the adverse effects caused by electrical, optical and temperature factors, and therefore, it is able to provide a significantly low S/N ratio in the detection signal S0.

Further, it is reminded that the wave plate 17 can be omitted from the present sampling oscilloscope without affecting the instrument sensitivity.

[Embodiment 2]

Figure 2:
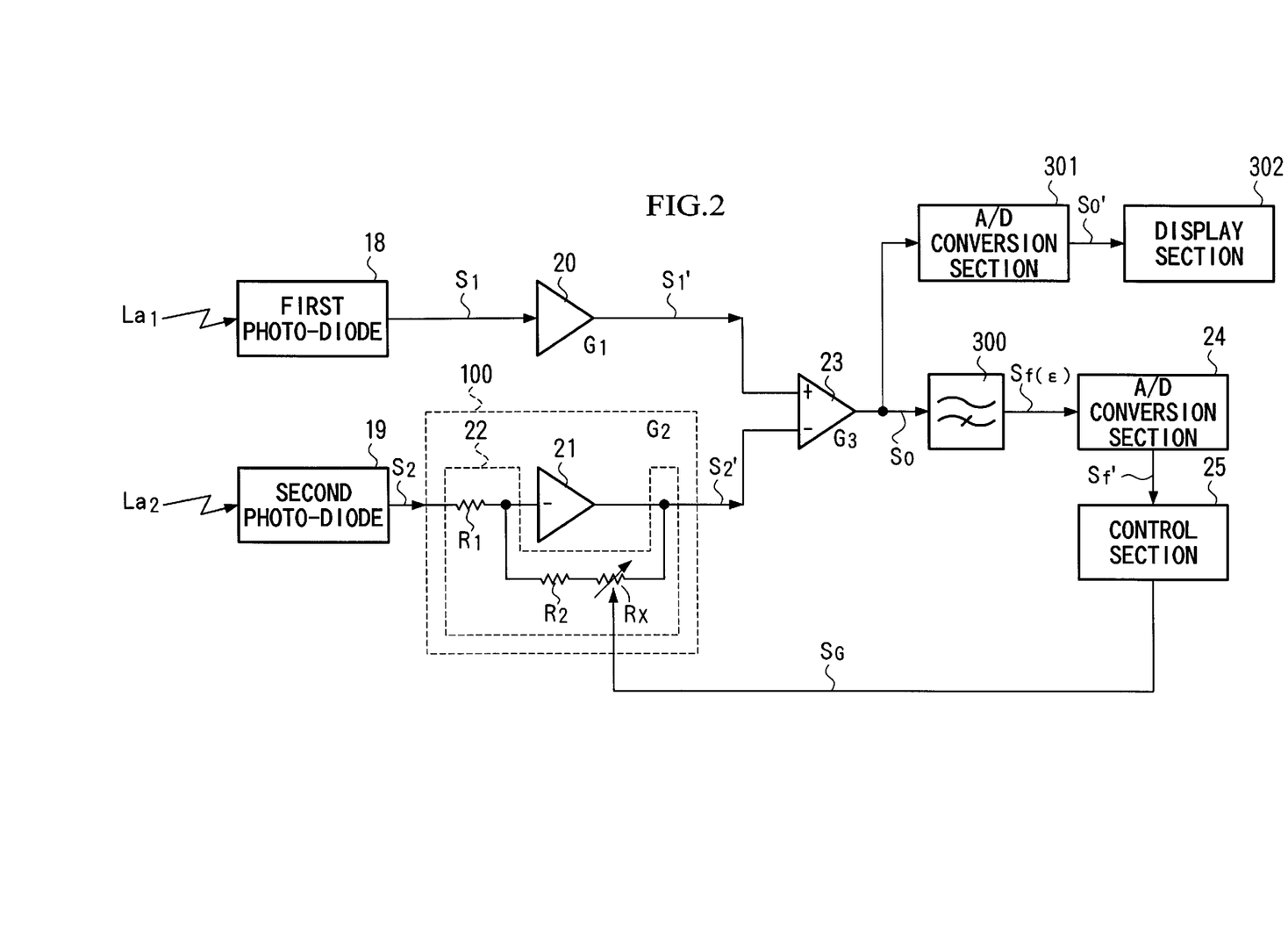
FIG. 2 is a schematic circuit diagram of a second embodiment of the electro-optic sampling oscilloscope of the present invention.

Next, a second embodiment of the e-o sampling oscilloscope will be presented. FIG. 2 shows a block diagram of the key parts of the instrument. Those parts that are the same as those in FIG. 1 are given the same reference numerals, and their explanations are omitted. In this instrument, a high-pass filter 300, an A/D conversion section 301 and a display section 302 have been added.

The feature of the sampling oscilloscope of the second embodiment is that S/N adjustments can be performed even during the measuring operation.

The high-pass filter 300 shown in FIG. 2 is inserted between the differential amplifier 23 and the A/D conversion section 24, and transmits base band signal components of the reference laser beam La0, but blocks target signal component. Specifically, the high-pass filter 300 selects only the base band signals from the detection signal S0 containing the base band signal components and target signal component, and transmits only the base band signal component as the base band signals Sf. The A/D conversion section 24 converts the base band signals Sf into digitized base band signals Sf'. The A/D conversion section 301 converts detection signal S0 into digitized detection signal S0'. The display section 302 displays the results of measurements according to the detection signal S0'.

Next, S/N adjustment operation during measurements of the target signal using the second embodiment instrument will be explained.

When the metal pin 5 shown in FIG. 5 is made to contact a target signal line (not shown), electrical field of a strength corresponding to the target signal level is coupled to the e-o crystal 7. Accordingly, the refractive index of the crystal 7 changes according to the strength level of the electrical field. In this state, a reference laser beam La0 is injected into the front surface of the e-o crystal 7, through the output end 11a of the connector 11, collimator lens 12, polarized beam splitter 13, Faraday element 14, ½ wave plate 15, polarized beam splitter 16 and the wave plate 17, as described in the first embodiment.

Polarization state of the reference laser beam La0 propagating in the e-o crystal 7 is changed. Polarization-affected reference laser beam La0 is reflected from the reflection mirror 8, and is output from the front surface of the e-o crystal 7, and is separated in the polarized beam splitter 16. The first signal light La1 produced by this splitting process is received by the first photo-diode 18 shown in FIG. 2.

In the meantime, the second signal light La2 produced by the polarized beam splitter 16 is diverted by the polarized beam splitter 13 to the second photo-diode 19 shown in FIG. 2.

Here, the first and second signal light La1 and La2 contains base band signal components as well as target signal component.

First signal light La1 shown in FIG. 2 is converted into first electrical signal S1 in the photo-diode 18, and the first electrical signal S1 are amplified to a gain G1 by the firs amplifier 20, and the amplified first electrical signal S1' are input in the (+) terminal of the differential amplifier 23.

In the meantime, the second electrical signal S2 are amplified to a gain G2, and the amplified second electrical signal S2' are input in the (−) terminal of the differential amplifier 23.

Accordingly, differential amplifier 23 amplifies first and second electrical signals S1' and S2', and the results are output as detection signal S0. The detection signal S0 contains the base band signal components as well as the target signal component, and it is supposed that noise components due to electrical, optical and temperature factors are contained in the base band signal components.

When the detection signal S0 is input in the high-pass filter 300, which outputs only the base band signal Sf containing the base band signal components to be input in the A/D conversion section 24. Following the process described earlier, the base band signal Sf is converted into digitized base band signals Sf', and are input in the control section 25.

At this time, the control section 25 adjusts the gain control signal SG so as to reduce the error level ε of the base band signals Sf' to zero according to feedback signals of base band signals Sf'.

The result is that, in the differential amplifier 23, the noise components contained in the detection signal S0, due to fluctuations caused by electrical, optical and temperature factors, are completely nullified.

In the meantime, the detection signal S0 input in the A/D conversion section 301 is converted into digitized detection signal S0', and are input in the display section 302. The detection signal S0' is constituted only by target signal, because the noise components are not contained in the analogue detection signal S0. Therefore, only the target signal with no noise components is displayed on the display section 302.

As explained above, because of the inclusion of the high-pass filter 300 in the e-o sampling oscilloscope of the second embodiment to extract the base band signals Sf, S/N adjustments can be performed even during measurement of target signal.

Also, according to the present instrument, the display section 302 displays detection signal S0 that have been subjected to S/N adjustment, so that waveforms of the target signal can be displayed with high precision.

[Embodiment 3]

Figure 3:
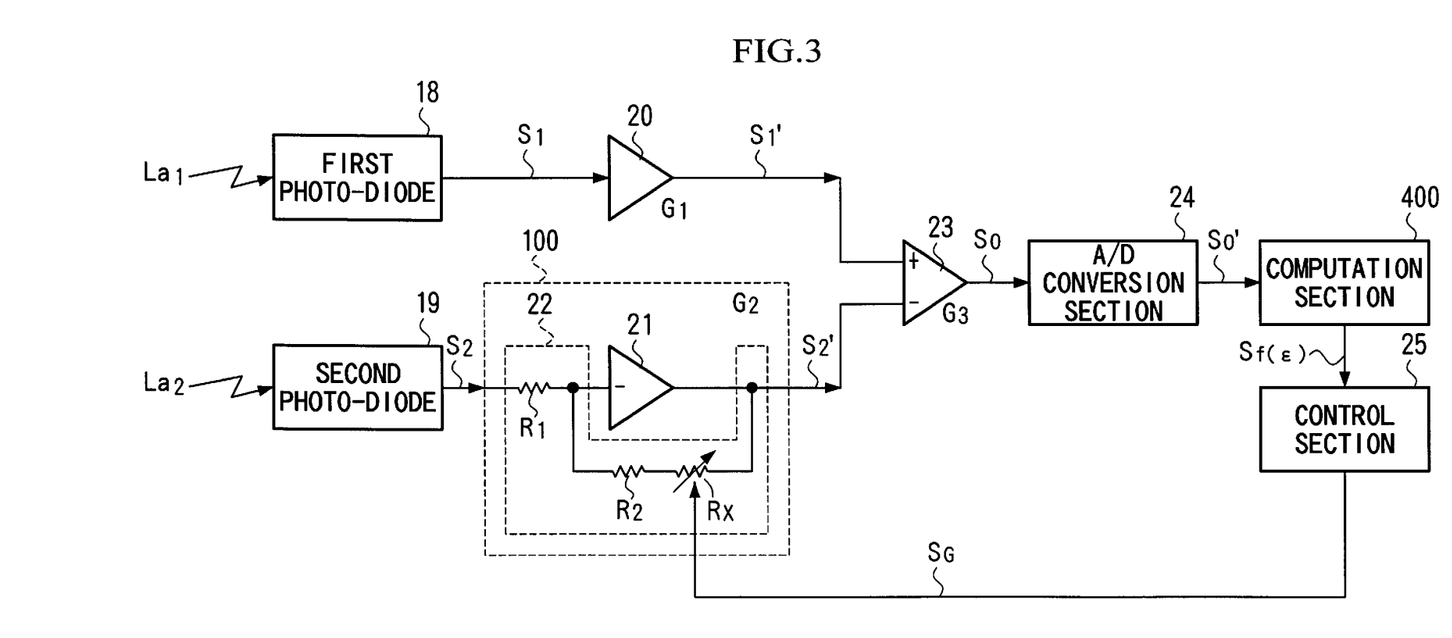
FIG. 3 is a schematic circuit diagram of a third embodiment of the electro-optic sampling oscilloscope of the present invention.

Next, a third embodiment of the e-o sampling oscilloscope will be presented. FIG. 3 shows a block diagram of the key parts of the instrument. Those parts that are the same as those in FIG. 1 are given the same reference numerals, and their explanations are omitted. In this instrument, a computation section 400 has been added.

As in the second embodiment, the feature of the sampling oscilloscope of the third embodiment is that S/N adjustments can be performed even during the sampling operation.

The computation section 400 is a digital filter inserted between the differential amplifier 23 and the control section 25, and transmits base band signal components of the reference laser beam La0, but blocks target signal component. The computation section 400 transmits only base band signal Sf containing only the base band signals by digital filtering of detection signal S0' containing digitized base band signal components and target signal component.

Next, S/N adjustment operation during measurement operation of target signal using the third embodiment instrument will be explained.

When the metal pin 5 shown in FIG. 5 is made to contact a target signal line (not shown), electrical field of a strength corresponding to the target signal level is coupled to the e-o crystal 7. Subsequently, by following the process described earlier, first signal light La1 is converted into first electrical signal S1 in the first photo-diode 18, and the first electrical signal S1 is amplified in the first amplifier 20 to a gain of G1, and the amplified electrical signal S1' is input in the (+) terminal of the differential amplifier 23.

In the meantime, second electrical signal S2 is amplified in the second amplifier 100 to a gain of G2, and the amplified second electrical signal S2' is input in the (−) terminal of the differential amplifier 23.

Accordingly, differential amplifier 23 amplifies first and second electrical signals S1' and S2', and the results are output as detection signal S0. The detection signal S0 contains the base band signal components as well as target signal component, and it is supposed that noise components due to electrical, optical and temperature factors are contained in the base band signal components.

The detection signal S0 is converted to digitized detection signal S0' in the A/D conversion section 24, and is input in the computation section 400. Accordingly, the computation section 400 transmits, through digital filtering, only the base band signal components contained in the detection signal S0' and base band signal Sf is output to the control section 25.

At this time, the control section 25 adjusts the gain control signal SG so as to reduce the error level ε of the base band signal Sf' to zero according to feedback signals of base band signal Sf'.

The result is that, in the differential amplifier 23, the noise components contained in the detection signal S0, due to fluctuations caused by electrical, optical and temperature factors, are completely nullified.

As explained above, because of the inclusion of the computation section 400 in the e-o sampling oscilloscope of the third embodiment to extract the base band signal Sf, S/N adjustments can be performed even during measurement of target signal.

In the various foregoing embodiments, it should be noted that the specific configurations are not limited only to those presented, and design modifications can be made within the scope of the principles demonstrated.

For example, in the e-o sampling oscilloscopes presented in first to third embodiments, the examples related to adjusting the gain G2 of the second amplifier 100 shown in FIGS. 1~3, but the same effects can be achieved by adjusting the gain G1 of the first amplifier 20. In this case, a gain adjustment section 22 is provided in the first amplifier 20.

Figure 4:
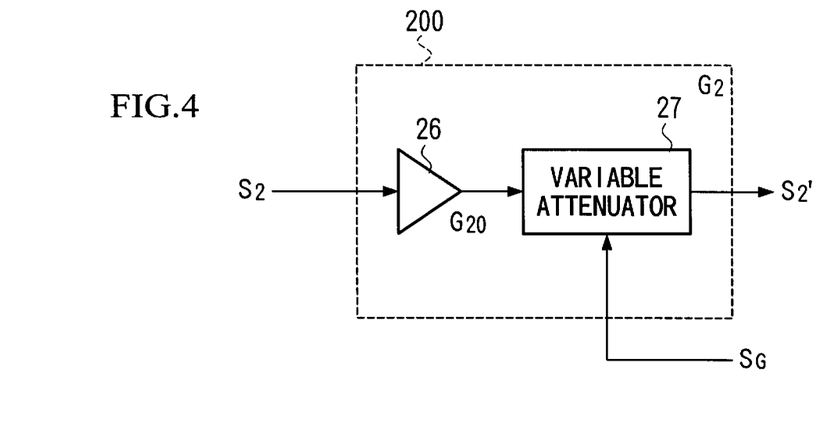
FIG. 4 is a variation of the electro-optic sampling oscilloscope presented in the first to third embodiments.

Also, in the e-o sampling oscilloscopes presented in first to third embodiments, the second amplifier 100 shown in FIGS. 1~3 may be replaced with the second amplifier 200 shown in FIG. 4. The second amplifier 200, similar to the second amplifier 100, provides variable gain G2 to the second electrical signal S2. The second amplifier 200 is comprised by an amplification section 26 and a variable attenuator 27. The variable attenuator 27 has the same capability as the gain adjustment section 22 (refer to FIG. 1), and attenuates output signals from the amplification section 26 according to the gain control signal SG.

What is claimed is:

1. An electro-optic sampling oscilloscope comprising:
   a light generation section for generation a reference laser beam;
   a crystal, exhibiting an electro-optic response behavior so as to receive said reference laser beam and to result in changing a refractive index in accordance with electrical field strength generated by target signal;
   a reflection mirror formed on a rear surface of said crystal for reflecting said reference laser beam that has passed through said crystal;
   an optical circuit for separating said reference laser beam reflected from said reflection mirror into a first signal light and a second signal light;
   a first photo-electric conversion section for converting said first signal light into first electrical signals;
   a second photo-electric conversion section for converting said second signal light into second electrical signals;
   a differential amplification section for differentially amplifying said first electrical signals and said second electrical signals, and for outputting differentially amplified signals as detection signals of said target signal; and a gain adjustment section for varying gains to adjust a signal-to-noise ratio while said reference laser beam is not being radiated into said crystal, so as to match strength levels of said first electrical signals and said second electrical signals in association with feedback signals of said target signal.

2. An electro-optic sampling oscilloscope according to claim 1, wherein, for adjusting signal-to-noise ratio while a laser beam is being radiated into said crystal and a strength level of said target signal is zero, said gain adjustment section performs gain adjustments to match strength levels of said first electrical signals and said second electrical signals, in association with feedback signals of said target signal.

3. An electro-optic sampling oscilloscope comprising:
a light generation section for generation a reference laser beam;
a crystal, exhibiting an electro-optic response behavior so as to receive said reference laser beam and to result in changing a refractive index in accordance with electrical field strength generated by target signal;
a reflection mirror formed on a rear surface of said crystal for reflecting said reference laser beam that has passed through said crystal;
an optical circuit for separating said reference laser beam reflected from said reflection mirror into a first signal light and a second signal light;
a first photo-electric conversion section for converting said first signal light into first electrical signals;
a second photo-electric conversion section for converting said second signal light into second electrical signals;
a first amplifier for amplifying said first electrical signals to a first gain;
a second amplifier for amplifying said second electrical signals to a second gain;
a differential amplification section for differentially amplifying first amplified electrical signals amplified by said first amplifier and second amplified electrical signals amplified by said second amplifier, and for outputting differentially amplified signals as detection signals of said target signal; and
a gain adjustment section for varying gains to adjust a signal-to-noise ratio while said reference laser beam is not being radiated into said crystal, so as to match strength levels of said first electrical signals and said second electrical signals by adjusting either said first gain for said first amplifier or said second gain for said second amplifier in association with feedback signals of said target signal.

4. An electro-optic sampling oscilloscope according to claim 3, wherein, for adjusting signal-to-noise ratio while a laser beam is being radiated into said crystal and a strength level of said target signal is zero, said gain adjustment section performs gain adjustments to match strength levels of said first electrical signals and said second electrical signals, by adjusting either said first gain of said first amplifier or said second gain of said second amplifier.

5. An electro-optic sampling oscilloscope comprising:
a light generation section for generation a reference laser beam;
a crystal, exhibiting an electro-optic response behavior so as to receive said reference laser beam and to result in changing a refractive index in accordance with electrical field strength generated by target signal;
a reflection mirror formed on a rear surface of said crystal for reflecting said reference laser beam that has passed through said crystal;
an optical circuit for separating said reference laser beam reflected from said reflection mirror into a first signal light and a second signal light;
a first photo-electric conversion section for converting said first signal light into first electrical signals;
a second photo-electric conversion section for converting said second signal light into second electrical signals;
a differential amplification section for differentially amplifying said first electrical signals and said second electrical signals, and for outputting differentially amplified signals as detection signals of said target signal;
a filter section for transmitting only base band component contained in said detection signals as base band signals of said reference laser beam while blocking transmission of target signal contained in said detection signals; and
a gain adjustment section for varying gains to adjust a signal-to-noise ratio while said reference laser beam is being radiated into said crystal and said target signal are being output at a given level, so as to match strength levels of said first electrical signals and said second electrical signals by adjusting either said first gain for said first amplifier or said second gain for said second amplifier in association with feedback signals of said base band signals.

6. An electro-optic sampling oscilloscope according to claim 5, further comprising:
a display section for displaying wave-form of said target signals based on said detection signals.

7. An electro-optic sampling oscilloscope according to claim 5, wherein said filter section is a high-pass filter for transmitting only high frequency components in said detection signals.

8. An electro-optic sampling oscilloscope according to claim 6, wherein said filter section is a high-pass filter for transmitting only high frequency components in said detection signals.

9. An electro-optic sampling oscilloscope according to claim 5, wherein said filter section is a digital filter.

10. An electro-optic sampling oscilloscope according to claim 6, wherein said filter section is a digital filter.

11. An electro-optic sampling oscilloscope according to claim 1, wherein said gain adjustment section comprises a variable resistance and performs gain adjustment by varying a resistance value of said variable resistance in accordance with control signals based on said detection signals.

12. An electro-optic sampling oscilloscope according to claim 2, wherein said gain adjustment section comprises a variable resistance and performs gain adjustment by varying a resistance value of said variable resistance in accordance with control signals based on said detection signals.

13. An electro-optic sampling oscilloscope according to claim 3, wherein said gain adjustment section comprises a variable resistance and performs gain adjustment by varying a resistance value of said variable resistance in accordance with control signals based on said detection signals.

14. An electro-optic sampling oscilloscope according to claim 4, wherein said gain adjustment section comprises a variable resistance and performs gain adjustment by varying a resistance value of said variable resistance in accordance with control signals based on said detection signals.

15. An electro-optic sampling oscilloscope according to claim 5, wherein said gain adjustment section comprises a variable resistance and performs gain adjustment by varying a resistance value of said variable resistance in accordance with control signals based on said base band signals.

16. An electro-optic sampling oscilloscope according to claim 6, wherein said gain adjustment section comprises a variable resistance and performs gain adjustment by varying a resistance value of said variable resistance in accordance with control signals based on said base band signals.

17. An electro-optic sampling oscilloscope according to claim 7, wherein said gain adjustment section comprises a variable resistance and performs gain adjustment by varying a resistance value of said variable resistance in accordance with control signals based on said base band signals.

18. An electro-optic sampling oscilloscope according to claim 8, wherein said gain adjustment section comprises a variable resistance and performs gain adjustment by varying a resistance value of said variable resistance in accordance with control signals based on said base band signals.

19. An electro-optic sampling oscilloscope according to claim 9, wherein said gain adjustment section comprises a variable resistance and performs gain adjustment by varying a resistance value of said variable resistance in accordance with control signals based on said base band signals.

20. An electro-optic sampling oscilloscope according to claim 10, wherein said gain adjustment section comprises a variable resistance and performs gain adjustment by varying a resistance value of said variable resistance in accordance with control signals based on said base band signals.

* * * * *